United States Patent
Ohtsuki et al.

(10) Patent No.: US 8,877,609 B2
(45) Date of Patent: Nov. 4, 2014

(54) METHOD FOR MANUFACTURING BONDED SUBSTRATE HAVING AN INSULATOR LAYER IN PART OF BONDED SUBSTRATE

(75) Inventors: Tsuyoshi Ohtsuki, Annaka (JP); Wei Feng Qu, Annaka (JP); Fumio Tahara, Annaka (JP); Yuuki Ooi, Annaka (JP); Kiyoshi Mitani, Annaka (JP); Kyoko Mitani, legal representative, Takasaki (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 14/007,584

(22) PCT Filed: Apr. 10, 2012

(86) PCT No.: PCT/JP2012/002479
§ 371 (c)(1),
(2), (4) Date: Sep. 25, 2013

(87) PCT Pub. No.: WO2012/153461
PCT Pub. Date: Nov. 15, 2012

(65) Prior Publication Data
US 2014/0120695 A1 May 1, 2014

(30) Foreign Application Priority Data
May 11, 2011 (JP) ................................. 2011-106475

(51) Int. Cl.
*H01L 21/762* (2006.01)
*H01L 21/84* (2006.01)
*H01L 27/12* (2006.01)

(52) U.S. Cl.
CPC .... *H01L 21/76251* (2013.01); *H01L 21/76256* (2013.01); *H01L 21/84* (2013.01); *H01L 27/1207* (2013.01)
USPC 438/459; 256/347; 256/E21.32; 256/E21.545; 256/E21.561; 256/E21.569; 438/455; 438/456

(58) Field of Classification Search
USPC ............. 257/347, E21.32, E21.545, E21.561, 257/E21.569; 438/455, 456, 459
See application file for complete search history.

(56) References Cited

U.S. PATENT DOCUMENTS

| 5,399,507 A | 3/1995 | Sun |
| 5,894,152 A | 4/1999 | Jaso et al. |

(Continued)

FOREIGN PATENT DOCUMENTS

| JP | A-8-17694 | 1/1996 |
| JP | A-11-17001 | 1/1999 |

(Continued)

OTHER PUBLICATIONS

Sakaguchi et al., "Current Progress in Epitaxial Layer Transfer (ELTRAN)," *IEICE Transactions on Electrons*, vol. E80-C, No. 3, pp. 378-387, Mar. 1997.

(Continued)

*Primary Examiner* — Asok K Sarkar
(74) *Attorney, Agent, or Firm* — Oliff PLC (57) ABSTRACT

A method for manufacturing a bonded substrate that has an insulator layer in part of the bonded substrate includes: partially forming a porous layer or forming a porous layer whose thickness partially varies on a bonding surface of the base substrate; performing a heat treatment to the base substrate having the porous layer formed thereon to change the porous layer into the insulator layer, and thereby forming the insulator layer whose thickness partially varies on the bonding surface of the base substrate; removing the insulator layer whose thickness varies by an amount corresponding to a thickness of a small-thickness portion by etching; bonding the bonding surface of the base substrate on which an unetched remaining insulator layer is exposed to a bond substrate; and reducing a thickness of the bonded bond substrate and thereby forming a thin film layer.

16 Claims, 3 Drawing Sheets

(56) References Cited

U.S. PATENT DOCUMENTS

| | | | |
|---|---|---|---|
| 6,800,518 B2 * | 10/2004 | Bendernagel et al. | 438/207 |
| 2004/0040492 A1 * | 3/2004 | Sakaguchi | 117/84 |
| 2004/0048091 A1 * | 3/2004 | Sato et al. | 428/641 |
| 2004/0058511 A1 * | 3/2004 | Sakaguchi | 438/458 |
| 2005/0196934 A1 | 9/2005 | Tazoe et al. | |
| 2007/0202660 A1 | 8/2007 | Moriceau et al. | |

FOREIGN PATENT DOCUMENTS

| | | |
|---|---|---|
| JP | A-11-186566 | 7/1999 |
| JP | A-2005-229062 | 8/2005 |
| JP | A-2006-100479 | 4/2006 |
| JP | A-2008-516443 | 5/2008 |

OTHER PUBLICATIONS

Jun. 26, 2012 International Search Report issued in International Patent Application No. PCT/JP2012/002479.

* cited by examiner

POINT WHERE PROTECTIVE COAT WAS PROVIDED    POINT WHERE PROTECTIVE COAT WAS NOT PROVIDED

METHOD FOR MANUFACTURING BONDED SUBSTRATE HAVING AN INSULATOR LAYER IN PART OF BONDED SUBSTRATE

TECHNICAL FIELD

The present invention relates to a method for manufacturing a bonded substrate having an insulator layer in part of the bonded substrate, which is used for fabrication of a multi-functionalized device such as a device having a logic circuit, a DRAM, and others mixedly mounted thereon.

BACKGROUND ART

As a method for improving system performance of LSI, technology for integrating a logic circuit and a DRAM on the same semiconductor chip has been conventionally examined. On the other hand, in a single logic circuit configured mainly based on an MOSFET, to achieve high performance, an SOI-MOSFET using a thin-film SOI substrate in place of a conventional bulk silicon substrate has been examined and already put into production for an intended purpose of some of high-performance logic devices, and its superiority has been proved. In such a situation, taking further improvement of performance into account, development of LSI having a DRAM mixedly mounted on a high-performance logic chip, which has a logic circuit mounted on an SOI substrate, can be considered.

However, it is considered that mounting both the logic circuit and the DRAM has the following problem.

In an SOI-MOSFET, since the potential in a body region where a channel is formed floats due to presence of a BOX film, a fluctuation in characteristics, e.g., a leak current or a threshold value involved by a circuit operation may possibly occur owing to a floating-body effect. Therefore, like a cell transistor of a DRAM or a sense amplifier circuit, it is considered that mixed mounting is unsuitable for application to a circuit that has rigorous demands for, e.g., a leak current level or unevenness of a threshold value.

To solve this problem of the floating-body effect, an extraction device region from a body portion and a contact must be provided with respect to an MOSFET pattern and the body potential must be controlled, but there is a problem that a cell area or an area of a sense amplifier unit is thereby greatly increased, and high integration, which is the greatest characteristics of the DRAM, is deteriorated.

As countermeasures for this problem, various kinds of methods for forming a circuit unit, which is incompatible with the floating-body effect, in a non-SOI region by providing the non-SOI region on an SOI substrate (which is also referred to as partial SOI) have been also suggested.

For example, there is a method for partially removing an SOI layer and a buried insulator layer (a BOX layer) of an SOI substrate by etching, performing selective epitaxial growth of silicon in the etching region, and effecting polishing and flattening to form a non-SOI region (e.g., see Patent Literature 1). Further, there is also a method for forming a non-SOI region in which a bulk region is surrounded by an insulative spacer and a conductive spacer, overcoming a floating-body effect, and electrically separating an SOI region from the non-SOI region (see, e.g., Patent Literature 2).

However, in regard to any method, there is no detailed description concerning a configuration of the SOI substrate and a configuration of the BOX layer in the SOI region, and a method for more easily manufacturing a partial SOI substrate has been demanded.

CITATION LIST

Patent Literatures

Patent Literature 1: Japanese Unexamined Patent Publication (Kokai) No. H8-17694
Patent Literature 2: Japanese Unexamined Patent Publication (Kokai) No. H 11-17001
Patent Literature 3: Japanese Unexamined Patent Publication (Kokai) No. 2005-229062
Patent Literature 4: Japanese Unexamined Patent Publication (Kokai) No. 2006-100479

Non-Patent Literature

Non-patent Literature 1: "IEICE Transactions on Electron", Vol. 80-C, No. 3 (1997) pp. 378-387

DISCLOSURE OF INVENTION

Problems to be Solved by the Invention

Based on the above, the present inventors devised a method based on two technologies, i.e., (1) an oxidation rate of porous silicon is higher than that of normal single crystal silicon and (2) a porous silicon layer having an arbitrary thickness can be formed at an arbitrary position by forming a pattern at the time of fabricating porous silicon.

The porous silicon itself is reported in many patent literatures and others. Usage of this material corresponds to a method for fabricating an SOI wafer, and a method for fabricating an SOI wafer has been suggested like Patent Literatures 3 and 4 besides an ELTRAN (a registered trademark) substrate that has been reported from long ago like Non-patent Literature 1. A general porous silicon fabrication method is an anodic oxidation method, and it is roughly described as follows. First, an aqueous solution containing HF (hydrogen fluoride) is prepared, and silicon wafer is put into this solution. Further, a direct-current voltage is applied between this wafer and a counter electrode. At this time, a silicon substrate side is determined as an anode. A result (porosity) of porous silicon varies depending on parameters such as concentration of the HF aqueous solution, resistivity of the substrate, density of the applied current, a time, and others. The parameters that affect this porosity are explained in detail in, e.g., Non-patent Literature 1.

As methods for manufacturing an SOI substrate using such porous silicon, there have been conventionally devised (1) ELTRAN: a method for performing epitaxial growth on a porous silicon layer, bonding this layer to a wafer having an oxide film, and effecting delamination at the porous layer (Non-patent Literature 1), (2) a method for performing EP growth on a porous layer, then carrying out annealing in an oxidizing atmosphere to oxidize the porous layer, and forming this layer as a BOX film (internal oxidation of the porous layer, Patent Literature 3), (3) a method for gradually reducing porosity, forming porous silicon, turning a surface into single crystal based on migration by performing annealing, and turning an inner portion with high porosity into a BOX layer (Patent Literature 4), and others.

However, as to the SOI substrate manufactured by each of these methods, the porous layer and the BOX layer are uniformly formed in an entire radial region of the substrate, and hence the problem of the floating-body effect cannot be solved.

In view of the above-described problem, it is an object of the present invention to provide a method for easily manufacturing a bonded substrate having an insulator layer in part of the bonded substrate like a partial SOI substrate that is used for, e.g., integrating a logic circuit and a DRAM on the same semiconductor chip with use of the porous silicon technology.

Means for Solving the Problems

To achieve this object, according to the present invention, there is provided a method for manufacturing a bonded substrate that is formed by bonding a base substrate to a bond substrate and has an insulator layer in part of the bonded substrate, the method comprising at least: a porous layer forming step of partially forming a porous layer or forming a porous layer whose thickness partially varies on a bonding surface of the base substrate; an insulator layer forming step of performing a heat treatment to the base substrate having the porous layer formed thereon to change the porous layer into the insulator layer, and thereby forming the insulator layer whose thickness partially varies on the bonding surface of the base substrate; an insulator layer removing step of removing the insulator layer whose thickness varies by an amount corresponding to a thickness of a small-thickness portion by etching, and thereby exposing the unetched remaining insulator layer on part of the bonding surface of the base substrate; a bonding step of bonding the bonding surface of the base substrate on which the unetched remaining insulator layer is exposed to the bond substrate; and a thin film forming step of reducing a thickness of the bonded bond substrate and thereby forming a thin film layer.

According to the method for manufacturing a bonded substrate having such steps, when a difference in insulator layer forming rate between the portion where the porous layer is formed and the portion where the porous layer is not formed in the base substrate is used, the insulator layer whose thickness partially varies can be formed by the heat treatment, the insulator layer whose thickness varies is etched by an amount corresponding to the thickness of the small-thickness portion, and then the base substrate is bonded to the bond substrate, thereby easily manufacturing the bonded substrate having the insulator layer in part of the bonded substrate at a low cost.

Further, the insulator layer is consequently formed at the position of the porous layer which is partially formed or the porous layer which is formed with a partially increased thickness and moreover, the thickness of the insulator layer to be formed is determined in accordance with the thickness of the porous layer. Therefore, the insulator layer having the optimum thickness can be assuredly formed at an arbitrary position of the substrate to be manufactured in accordance with a shape, a size, properties, and others of a device to be formed later.

Furthermore, at the time of fabricating a multi-functionalized device having a logic circuit, a DRAM, and others mixedly mounted on the same substrate, since a device can be formed at the position of the insulator layer having the optimum film thickness of the thus manufactured bonded substrate, the bonded substrate that enables fabricating a high-performance multi-functionalized device can be provided even though the number of fabricating steps is reduced.

Moreover, in this case, it is possible that at the porous layer forming step, in case of forming the porous layer whose thickness partially varies on the bonding surface of the base substrate, at least a protective coat is formed on the bonding surface of the base substrate, a resist mask is formed on the protective coat, the protective coat is patterned into a shape of the resist mask, the resist mask is removed, the porous layer is formed on the bonding surface having the patterned protective coat, and the porous layer whose thickness partially varies is thereby formed on the entire bonding surface of the base substrate.

According to such a porous layer forming step, since the porous layer is deeply formed at a point where the protective coat on the base substrate is not provided and the porous layer is shallowly formed at a point where the protective coat is provided, the porous layer whose thickness partially varies can be more easily formed on the entire bonding surface of the base substrate, which is preferable.

Moreover, in this case, it is possible that at the porous layer forming step, in case of partially forming the porous layer on the bonding surface of the base substrate, at least a resist mask is formed on the bonding surface of the base substrate, the porous layer is formed on the bonding surface having the resist mask formed thereon, the resist mask is thereafter removed, and the porous layer is thereby partially formed on the bonding surface of the base substrate.

According to such a porous layer forming step, since the porous layer is not formed at a position on the base substrate where the resist mask is formed, the porous layer can be more easily partially formed on the bonding surface of the base substrate.

Additionally, in this case, it is possible that at the porous layer forming step, the porous layer is partially formed or the porous layer whose thickness partially varies is formed on the bonding surface by anodizing the bonding surface of the base substrate.

According to such an anodic oxidation method, the porous layer can be more easily formed, and the thickness, porosity, the pore diameter of the porous layer can be easily controlled in accordance with use application of the substrate, which is preferable.

Further, at this time, it is preferable that at the porous layer forming step, in case of forming the porous layer whose thickness partially varies on the bonding surface of the base substrate, the protective coat is removed with anodizing the bonding surface of the base substrate having the patterned protective coat formed thereon.

According to such a porous layer forming step, since the porous layer is deeply formed at a position where the protective coat is not provided and the porous layer is not formed at a position where the protective coat is provided until the protective coat is removed by the anodic oxidation, the porous layer is more shallowly formed. As a result, the porous layer whose thickness partially varies can be more easily formed on the entire bonding surface of the base substrate.

Furthermore, at this time, it is possible that a partial SOI substrate having an insulator layer in part of the bonded substrate is manufactured by using a silicon substrate for the base substrate and/or a bond substrate.

As described above, when the silicon substrate is used for the base substrate, the porous layer can be easily formed at the porous layer forming step, and the oxide film can be easily formed as the insulator layer at the insulator layer forming step, which is preferable. Moreover, when the silicon substrate is used for the bond substrate, the thin film layer formed at the thin film forming step serves as a so-called SOI layer, and various multi-functionalized devices each having a logic circuit, a DRAM, and others mixedly mounted thereon can be easily manufactured, which is preferable.

Moreover, when the silicon substrate is used for both the base substrate and the bond substrate, the conventional manufacturing process can be applied without complicating the configuration itself, and the method for manufacturing a bonded substrate that enables manufacture with a good yield ratio at a low cost can be provided, which is preferable.

Additionally, at this time, it is preferable that at the insulator layer forming step, the insulator layer whose thickness partially varies is formed by performing a thermal oxidation treatment to the base substrate having the porous layer formed thereon to change the porous layer into an oxide film.

When the oxide film is formed as the insulator layer by the thermal oxidation treatment, the insulator layer whose thickness partially varies can be further easily formed on the bonding surface of the base substrate. Further, since the oxide film has excellent insulation properties, it is preferable as the insulator layer.

Effect of the Invention

As described above, according to the present invention, the method for manufacturing a bonded substrate having an insulator layer in part of the bonded substrate can be easily provided at a low cost.

Furthermore, the insulator layer having an optimum thickness can be assuredly formed at an arbitrary position of the substrate to be manufactured in accordance with a shape, a size, properties, and others of a device that is to be formed after manufacture of the substrate.

Moreover, in case of fabricating a device having a logic circuit, a DRAM, and others mixedly mounted on the same substrate, since a device can be formed at a position of the insulator layer having an optimum film thickness on the substrate, the bonded substrate that enables fabricating the high-performance multi-functionalized device while reducing the number of fabrication steps can be provided.

BEST MODE FOR CARRYING OUT THE INVENTION

Although an embodiment according to the present invention will now be described hereinafter, the present invention is not restricted thereto.

To solve the problem of the above-described floating-body effect, an extraction device region from a body portion and a contact must be provided with respect to an MOSFET pattern and a body potential must be controlled, but there is a problem that a cell area or an area of a sense amplifier unit is thereby greatly increased and high integration, which is the greatest characteristics of the DRAM, is deteriorated.

As countermeasures for this problem, for example, the method disclosed in each of Patent Literature 1 and Patent Literature 2 has been suggested as a method for forming a circuit unit, which is incompatible with the floating-body effect, in a non-SOI region by providing the non-SOI region on an SOI substrate.

However, in any method, there is no detailed description concerning a configuration of the SOI substrate and a configuration of a BOX layer in the SOI region, and a method for more easily manufacturing a partial SOI substrate has been demanded.

The present inventors found out that, when a difference in insulator layer forming rate between a portion where a porous layer is formed and a portion where a porous layer is not formed in a base substrate is used, an insulator layer whose thickness partially varies can be formed by a heat treatment, the insulator layer whose thickness varies is etched by an amount corresponding to the thickness of the small-thickness portion, and then the base substrate is bonded to the bond substrate, thereby easily manufacturing the bonded substrate having the insulator layer in part of the bonded substrate at a low cost, and they brought the present invention to completion.

Figure 1:
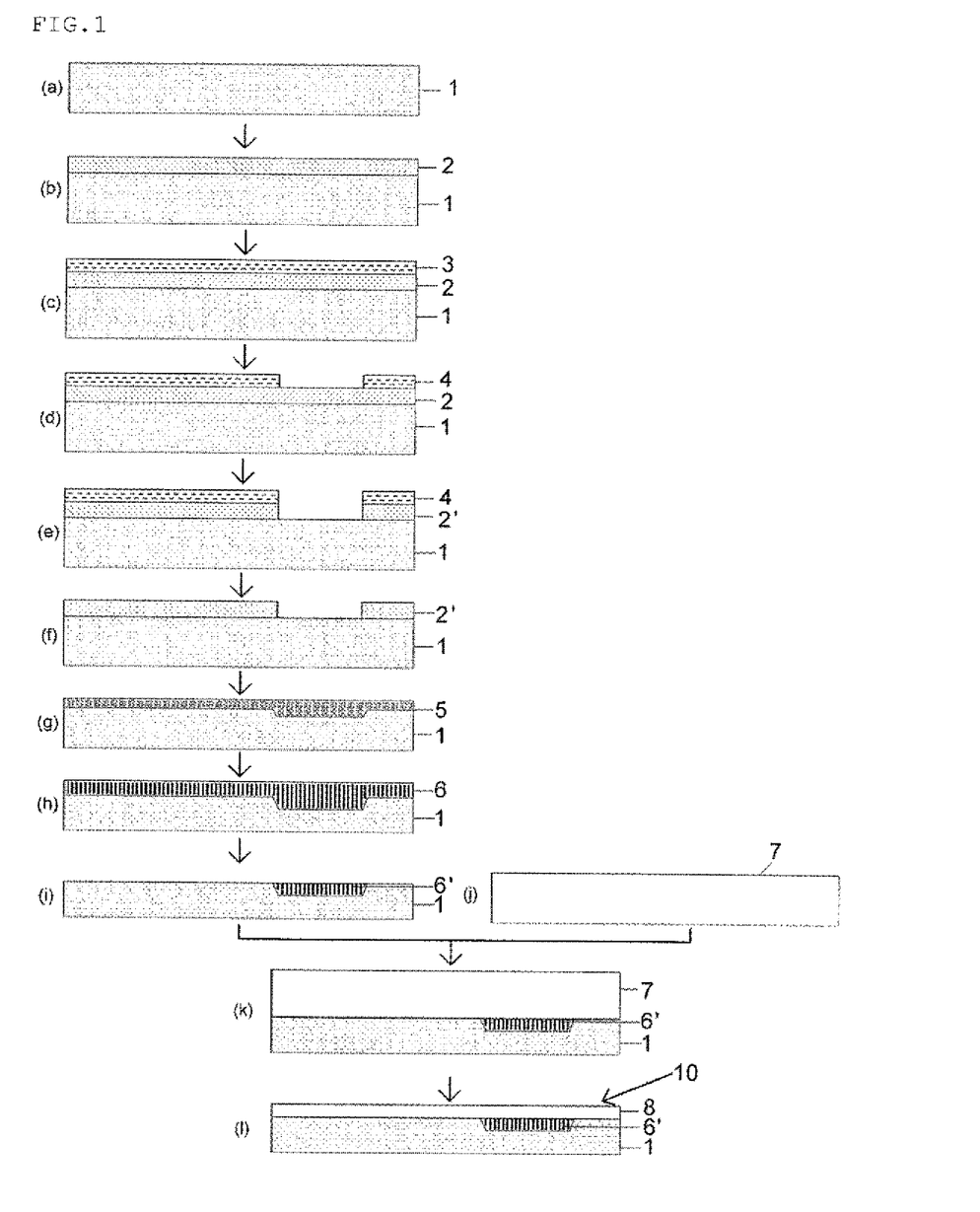
FIG. 1 is a flowchart showing a first mode of a process for manufacturing a bonded substrate according to the present invention.
Figure 2:
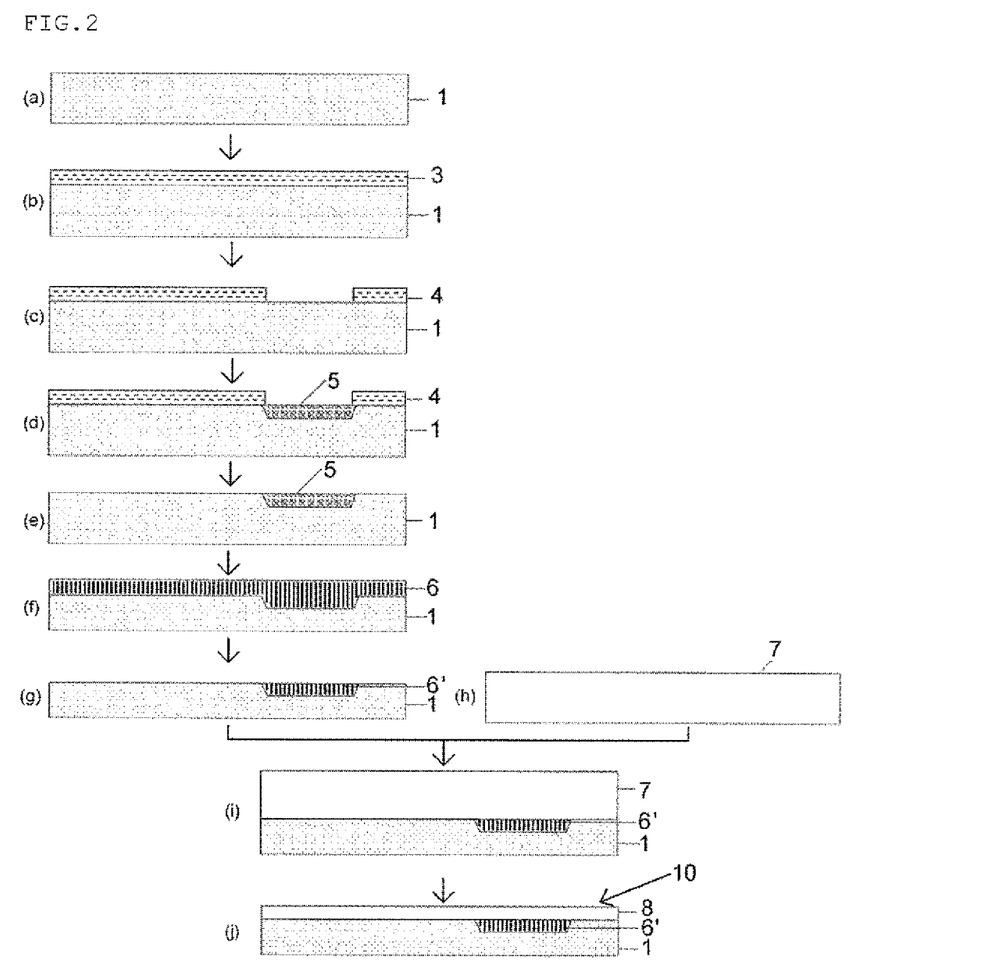
FIG. 2 is a flowchart showing a second mode of a process for manufacturing a bonded substrate according to the present invention.

Although embodiments according to the present invention will now be described with reference to FIG. 1 and FIG. 2, the present invention is not restricted thereto. FIG. 1 and FIG. 2 are flowcharts showing a first mode and a second mode of a process for manufacturing a bonded substrate according to the present invention.

[Porous Layer Forming Step]

At a porous layer forming step according to the present invention, a porous layer 5 is partially formed on a bonding surface of a base substrate 1 or a porous layer 5 whose thickness partially varies is formed on the same (FIGS. 1(a) to (g), FIGS. 2(a) to (e)). When this porous layer forming step is carried out, a difference in insulator layer forming rate between a portion of the base substrate where the porous layer is formed and a portion of the same where the porous layer is not formed can be utilized, and therefore an insulator layer whose thickness partially varies can be formed at a later-described insulator layer forming step.

Although the base substrate 1 according to the present invention is not restricted in particular, it is preferably a silicon substrate or more preferably a silicon single crystal substrate. When the base substrate 1 is a silicon substrate or a silicon single crystal substrate in particular, handling is easy, and porous silicon can be readily formed as the porous layer as will be described later. Obviously, any other semiconductor substrate made of a compound semiconductor or the like or a quartz substrate can be also used.

Although the first and second modes of the porous layer forming step will be explained by way of example hereinafter, the porous layer forming step according to the present invention is not restricted thereto.

As the first mode of the porous layer forming step, in case of forming the porous layer whose thickness partially varies on a bonding surface of the base substrate, at least a protective coat 2 is formed on the bonding surface of the base substrate 1, a resist film 3 is applied to the upper side of the protective coat 2, a resist mask 4 is formed by the photolithography, the protective coat 2 is patterned into a shape of the resist mask 4, the resist mask 4 is removed, and the porous layer 5 is formed on the bonding surface of the base substrate 1 having a pattered protective coat 2', whereby the porous layer 5 whose thickness partially varies can be formed on the entire bonding surface of the base substrate 1 (see FIGS. 1(a) to (g)).

According to such a porous layer forming step, since the porous layer is deeply formed at a point where no protective coat is provided and the porous layer is shallowly formed at a point where the protective coat is provided, the porous layer whose thickness partially varies can be easily formed on the entire bonding surface of the base substrate, which is preferable. A description will now be given with reference to FIG. 1.

As shown in FIG. 1, first, the protective coat 2 is formed on the prepared base substrate 1 (FIGS. 1(a) and (b)). Although a film thickness of this protective coat relates to a film thickness of an insulator layer 6 to be formed on the base substrate 1, a specific thickness is determined in relation to a method for forming the porous layer 5, e.g., conditions of a later-described anodic oxidation method. That is, in case of forming the porous layer 5 by the anodic oxidation method, an etching rate for the protective coat 2 differs depending on the conditions or especially HF concentration, and hence the film thickness of the protective coat 2 is greatly dependent on the later anodic oxidation conditions. At this time, forming the protective coat 2 as an oxide film is preferable.

Thereafter, the resist film 3 is applied to the upper side of the protective coat 2 (FIG. 1(c)), and the resist mask 4 is formed by the photolithography (FIG. 1(d)). Subsequently, the protective coat 2 is patterned into a shape of the resist mask 4 by etching or the like, the patterned protective coat 2' is obtained (FIG. 1(e)), and the resist mask 4 is removed (FIG. 1(f)). Such photolithography for pattern formation can be carried out by a general method.

In this case, a pattern of the resist mask 4 formed in FIG. 1(d) is associated with a point where a thickness of the insulator layer 6 is to be changed. Since the patterned protective coat 2' functions to avoid formation of the porous layer 5, the porous layer 5 is shallowly formed at a point that is covered with the patterned protective coat 2', and the porous layer 5 is deeply formed at a point that is not covered with the same. Therefore, after the insulator layer forming step, the point that is covered with the patterned protective coat 2' is a point where the insulator layer 6 is thin, and the point that is not covered with the patterned protective coat 2' is a point where the insulator layer 6 is thick. It is to be noted that the point which is not covered with the patterned protective coat 2' and where the insulator layer 6 is thickly formed is a point where an unetched remaining insulator 6' is formed in a bonded substrate 10 which is produced later.

Then, the porous layer 5 is formed on the bonding surface of the base substrate 1 having the patterned protective coat 2' (FIG. 1(g)). When the porous layer 5 is formed with respect to the base substrate 1 having the thus patterned protective coat 2', formation of the porous layer 5 is delayed at the point that is covered with the patterned protective coat 2' as compared with the point that is not covered with the same, and the porous layer 5 whose thickness partially varies is eventually formed. In particular, when a method of advancing formation of the porous layer 5 toward the inside of the substrate, e.g., the later-described anodic oxidation method is used, the base substrate 1 having no step on a surface thereof, i.e., having a flat surface is formed. When the bonding surface of the base substrate 1 after the porous layer 5 is formed is flat, bonding is easy, which is preferable.

Further, as a second mode of a porous layer forming step, in case of partially forming the porous layer on a bonding surface of a base substrate, at least a resist film 3 is applied to the bonding surface of the base substrate 1, a resist mask 4 is formed by the photolithography, a porous layer 5 is formed on the bonding surface of the base substrate 1, then the resist mask 4 is removed, and the porous layer 5 is preferably partially formed on the bonding surface of the base substrate 1 (see FIGS. 2(a) to (e)).

According to such a porous layer forming step, the porous layer can be easily partially formed on the boning surface of the base substrate, which is preferable. A description will now be given with reference to FIG. 2.

As shown in FIG. 2, first, the resist film 3 is applied to the upper side of the prepared base substrate 1 (FIGS. 2(a) and (b)), and the resist mask 4 is formed by the photolithography (FIG. 2(c)). Such photolithography for patterning can be carried out with use of a general method. This pattern is associated with a point where a film thickness of an insulator layer 6 is to be increased. In this case, after an insulator layer forming step, a point that is covered with the resist mask 4 serves as a point where the insulator layer 6 is thin, and a point that is not covered with the resist mask 4 serves as a point where the insulator layer 6 is thick. It is to be noted that the point which is not covered with the resist mask 4 and where the insulator layer 6 is thickly formed is a point where an unetched remaining insulator layer 6' is formed in a bonded substrate 10 that is produced later.

Thereafter, the porous layer 5 is formed on the bonding surface of the base substrate 1 having the resist mask 4 (FIG. 2(d)), and the resist mask 4 is removed (FIG. 2(e)). When the porous layer 5 is formed with respect to the base substrate 1 having the resist mask 4 in this manner, since formation of the porous layer 5 does not advance at the point covered with the resist mask 4, the porous layer 5 can be partially formed on the bonding surface of the base substrate 1. In particular, when a method of advancing formation of the porous layer 5 toward the inside of the substrate, e.g., the later-described anodic oxidation method is used, the base substrate 1 having no step on a surface thereof, i.e., having a flat surface is formed. When the bonding surface of the base substrate 1 after the porous layer 5 is formed is flat, bonding is easy, which is preferable.

Furthermore, at the porous layer forming step in each of the first and second modes, when the bonding surface of the base substrate is subjected to anodic oxidation, the porous layer is partially formed or the porous layer whose thickness partially varies is formed on the bonding surface of the base substrate, which is preferable. According to such an anodic oxidation method, the porous layer can be easily formed, and a thickness, porosity, and a pore diameter of the porous layer can be easily controlled in accordance with use application, which is preferable. The method adopting this anodic oxidation method will now be described hereinafter.

For example, when a current is allowed to flow by using the base substrate 1 such as a silicon single crystal substrate as an anode in an anodic oxidation liquid such as an HF (hydrogen fluoride) containing liquid, the porous layer 5 (a porous body) having micropores each having a diameter of several nm is formed on the surface of the base substrate 1 (see FIG. 1(g) and FIG. 2(d)). Here, when a composition of the anodic oxidation liquid, e.g., the HF containing liquid, ion concentration, or a current value is changed, porosity, thickness, a pore diameter, and others of the porous layer 5 can be adjusted. For example, when the HF concentration is 30% and a current application time is 8 seconds, the thickness of the porous layer 5 can be approximately 200 nm and the porosity can be approximately 40%. The porosity, the thickness, the pore diameter, and others of the porous layer 5 that are dependent on the conditions of the anodic oxidation method can be determined while considering a required film thickness or the like of the insulator layer.

Moreover, at the porous layer forming step, in case of forming the porous layer 5 whose thickness partially varies on the bonding surface of the base substrate 1 (see FIGS. 1(a) to (g)), it is preferable to perform anodic oxidation to the bonding surface of the base substrate 1 and remove the patterned protective coat 2'. In this case, since the porous layer 5 is deeply formed at a point which is not covered with the patterned protective coat 2 and the porous layer 5 is not formed at a point that is covered with the patterned protective coat 2' until the protective coat 2 is removed by HF, and hence the porous layer 5 to be formed is shallow. Therefore, the porous layer 5 whose thickness partially varies can be easily formed on the entire bonding surface of the base substrate 1.

It is to be noted that the porous layer 5 may be formed by any other method than the anodic oxidation method. For example, the porous layer 5 can be also formed by dry-etching or wet-etching the base substrate 1 through a mask having many fine openings.

Additionally, as the base substrate 1 and/or a bond substrate 7 that is prepared in FIGS. 1(a) and (j) and FIGS. 2(a) and (h), using a silicon substrate or especially a silicon single crystal substrate is preferable. When the silicon substrate is used as the base substrate 1 in this manner, the porous layer 5 can be easily formed at the porous layer forming step, and porous silicon as the porous layer 5 can be easily formed by the anodic oxidation method, which is preferable. Further, at the insulator layer forming step, the insulator layer 6 can be easily formed on the base substrate 1, which is preferable. Furthermore, when the silicon substrate is used as the bond substrate 7, a thin film layer 8 formed at a thin film forming step turns to a so-called SOI layer, and it can function as a partial SOI substrate which can be applied to manufacture of various multi-functionalized devices each having a logic circuit, a DRAM, and others mixedly mounted thereon and which has an insulator layer in part of the bonded substrate, which is preferable. Moreover, when the silicon substrate is used for both the base substrate 1 and the bond substrate 7, a method for manufacturing a bonded substrate that enables manufacture with a good yield ratio at a low cost, in which occurrence of warpage is suppressed, a configuration itself does not become complicated and a conventional process can be applied, can be provided, which is preferable.

[Insulator Layer Forming Step]

At the insulator layer forming step according to the present invention, when the porous layer 5 is changed into the insulator layer 6 by performing a heat treatment to the base substrate 1, the insulator layer 6 whose thickness partially varies is formed on the bonding surface of the base substrate 1 (FIG. 1(h), FIG. 2(f)). In this case, at the insulator layer forming step, it is preferable to form the insulator layer 6 whose thickness partially varies on the bonding surface of the base substrate 1 by performing a thermal oxidation treatment to the base substrate 1 having the porous layer 5 formed thereon to change the porous layer 5 into an oxide film. When the oxide film is formed in this manner, the insulator layer 6 whose thickness partially varies can be more easily formed on the bonding surface of the base substrate 1. Oxidizing conditions and an oxidizing method at this moment are appropriately determined based on a film thickness or the like of an insulator layer 6' provided in part of the bonded substrate 10 to be manufactured.

The present inventors discovered that a rate of forming the insulator layer 6 is higher at the porous layer 5 than on the surface of the regular base substrate 1. For example, when a silicon single crystal substrate is used as the base substrate 1, a porous silicon layer as the porous layer 5 has an oxidation rate that is approximately 1.5-fold of that of any other silicon single crystal substrate. Based on this difference in forming rate, it is possible to form the porous layer 5 into the insulator layer 6 selectively and quickly. As a result, an oxide film as the insulator layer 6 according to a thickness of the porous layer 5 can be formed. As oxidation conditions at this moment, considering a use application of an advanced device such as a multi-functionalized device, since a relatively thin oxide film whose thickness is less than 1 μm is required, a relatively low temperature of 1000° C. or less is preferred, but a thick oxide film can be also formed as a matter of course and, in this case, a method of a high oxidation rate like steam oxidation and a high temperature, e.g., 1100° C. is preferred.

[Insulator Layer Removing Step]

At the insulator layer removing step according to the present invention, in the insulator layer 6, whose thickness varies, the amount corresponding to a thickness of a small-thickness portion is removed by etching, and the unetched remaining insulator layer 6' is exposed on part of the bonding surface of the base substrate 1 (FIG. 1(i), FIG. 2(g)). In this manner, the small-thickness portion of the insulator layer 6 is removed by etching, and the large-thickness portion of the same is thinned by an amount corresponding to the thickness of the small-thickness portion, whereby a point having the insulator layer and a point having no insulator layer are formed on the bonding surface of the base substrate 1. Although an etching method at this time is not restricted in particular, for example, an HF treatment can be adopted. It is to be noted that, when the insulator layers 6 are formed on both bonding surfaces of the base substrate 1 and the bond substrate 7 at the insulator layer forming step, the respective insulator layers 6 formed on both the substrates are etched, and each of the insulator layers 6 is thinned by an amount corresponding to the thickness of the small-thickness portion, whereby the point having the insulator layer and the point having no insulator layer are formed on the bonding surfaces of both the substrates.

[Bonding Step]

At the bonding step according to the present invention, the bonding surface of the base substrate 1 on which the unetched remaining insulator layer 6' is exposed is bonded to the bond substrate 7 (FIG. 1(k), FIG. 2(i)). Additionally, at the bonding step according to the present invention, a bonding heat treatment can be additionally carried out in order to raise bonding strength after bonding. Conditions of this bonding step are not restricted in particular, and any condition for fabricating a regular bonded substrate can be applied.

[Thin Film Forming Step]

At the thin film forming step according to the present invention, after the bonding step, a film thickness of the bonded bond substrate 7 is reduced, and the thin film 8 is thereby formed (FIG. 1(l), FIG. 2(j)). As a thin film forming method in this case, a generally used method can be adopted, a method based on etching or polishing can be also used, or a method for implanting hydrogen ions into the bond substrate 7 before bonding to form an ion implanted layer, then performing a heat treatment, performing delamination at the ion implanted layer, and forming a thin film can be also adopted, for example.

Here, although the bond substrate 7 is not restricted in particular, it is preferable to use the bond substrate made of silicon or silicon single crystal in particular, namely, forming the thin film layer 8 as an SOI layer. If the thin film layer 8 is made of silicon, handling is easy, and various multi-functionalized devices each having a logic circuit, a DRAM, and others mixedly mounted thereon can be easily manufactured, which is preferable. The thin film layer may be made of any other semiconductor such as a compound semiconductor as a matter of course.

After the thin film forming step, for surface modification of the thin film layer 8, it is possible to perform a heat treatment, final polishing, and epitaxial growth. As these treatments for the surface modification or the like, treatments meeting surface quality required in actual device design can be appropriately selected. In this manner, a bonded substrate 10 having the insulator layer in part of the substrate can be manufactured. In the thus manufactured bonded substrate 10, the insulator layers associated with circuit characteristics of various respective circuits are formed, and mixedly mounting, e.g., a logic circuit, a DRAM, and others on the substrate enables fabricating a multi-functionalized device.

As described above, in the present invention, an insulator layer can be formed at an arbitrary point within a substrate surface, and high functionality of a device can be achieved by selecting the respective insulator layers associated with the circuit characteristics.

EXAMPLES

The present invention will now be more specifically explained hereinafter based on examples, but the present invention is not restricted to the following examples.

Example 1

Figure 3:
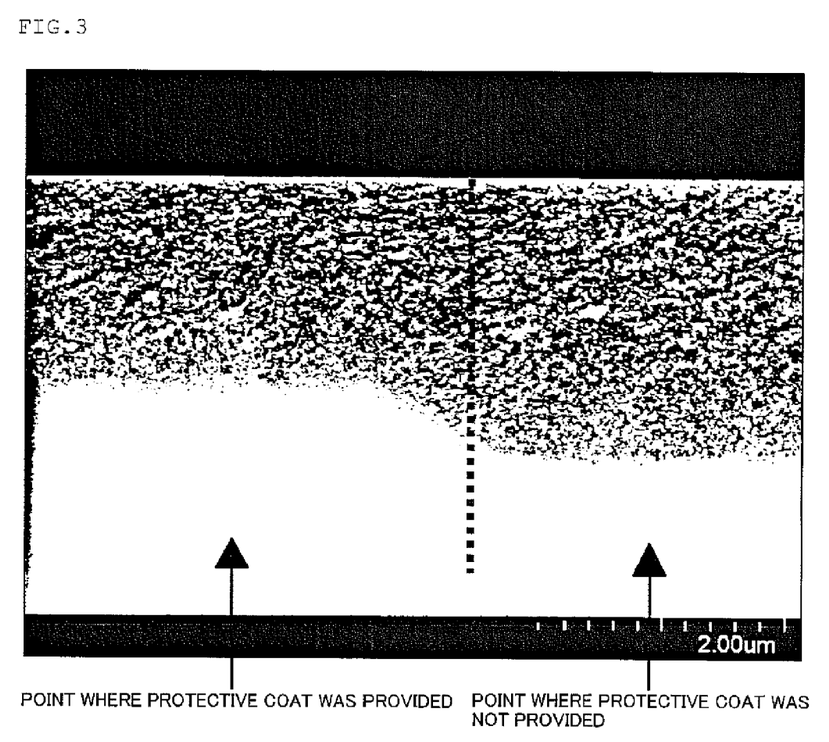
FIG. 3 is a cross-sectional picture of a base substrate having an insulator layer formed thereon in the first mode of the process for manufacturing a bonded substrate according to the present invention.

A boron-doped silicon single crystal substrate having resistivity of 0.05 Ω·cm and a diameter of 150 mm was used as a base substrate, a heat treatment was first performed with respect to this substrate at a temperature of 1000° C. in a Pyro atmosphere for 90 minutes, and an oxide film of 200 nm was formed as a protective coat. Then, a resist film was applied to the upper side of the substrate, and a resist mask was formed by photolithography. At this time, as the resist film, a negative resist was selected. An opening portion of a 1 mm square was formed at point where an insulator layer is provided when a bonded substrate is manufactured. In this substrate having the resist mask, the protective coat was etched with a buffered HF solution, the resist mask was removed with use of a mixed liquid of a sulfuric acid and hydrogen peroxide, then RCA cleaning was carried out, and thereby the protective coat was patterned into a shape of the resist mask. This base substrate was subjected to the anodic oxidation with HF concentration of 25% and a current application time of 50 seconds, and a porous layer having a thickness of approximately 100 nm and porosity of approximately 40% was formed. Since the porous layer is not formed at a point where the protective coat is provided until this protective coat is etched with HF, the porous layer whose thickness partially varies was consequently formed on a bonding surface of the base substrate. After the anodic oxidation, the base substrate was subjected to a thermal oxidation treatment in a Pyro atmosphere at a temperature of 1000° C. for 1 hour to change the porous layer into an oxide film, an insulator layer whose thickness partially varies was thereby formed on the bonding surface of the base substrate. In this case, the porous layer having no protective coat turned to an oxide film of 0.15 μm, and the porous layer having the protective coat turned to an oxide film of 0.09 μm. FIG. 3 shows a cross-sectional picture of the base substrate having the insulator layer formed thereon. As shown in FIG. 3, it was understood that the insulator layer whose thickness partially varies was formed on the bonding surface of the base substrate.

The base substrate having such an insulator layer formed thereon was immersed in 1% HF for 10 minutes, and the insulator layer was removed by an amount corresponding to a thickness of a small-thickness portion of the insulator layer, i.e., 0.09 μm by etching. As a result, a thickness of the oxide film remaining on the substrate without being etched was 0.06 μm. A boron-doped silicon substrate having resistivity of 0.05 Ω·cm and a diameter of 150 mm as a bond substrate was bonded to the base substrate having the oxide film as the insulator layer exposed on part of the bonding surface thereof in this manner, and a bonding heat treatment was performed at 1150° C. Then, the bond substrate was polished and formed into a thin film, thereby obtaining an SOI substrate having a silicon layer thickness of 10 μm. As described above, a partial SOI substrate having the oxide film with the thickness of 0.06 μm in part of the substrate was fabricated.

Example 2

A boron-doped silicon single crystal substrate having resistivity of 0.05 Ω·cm and a diameter of 150 mm was used as a base substrate, a resist film was first applied to the upper side of the substrate, and a resist mask was formed by the photolithography. At this time, as the resist film, a negative resist was selected. An opening portion of a 1 mm square was formed at point where an insulator layer is provided when a bonded substrate is manufactured. This base substrate was subjected to anodic oxidation with HF concentration of 25% and a current application time of 50 seconds, and a porous layer having a thickness of approximately 100 nm and porosity of approximately 40% was formed. A point that was anodically oxidized and a point that was not anodically oxidized were formed on the base substrate since a point where the resist mask is provided is not subjected to the anodic oxidation, and the porous layer was thereby partially formed on a bonding surface of the base substrate. After the anodic oxidation, the resist mask was removed with use of a mixed liquid of a sulfuric acid and hydrogen peroxide, then the base substrate was subjected to a thermal oxidation treatment in a Pyro atmosphere at a temperature of 1000° C. for 1 hour to change the porous layer into an oxide film, thereby an insulator layer whose thickness partially varies was formed on the bonding surface of the base substrate. In this case, an oxide film of 0.15 μm was formed at a point where the resist mask was not provided (the porous layer), and an oxide film of 0.09 μm was formed at a point where the resist mask was provided (the non-porous layer). When a cross section of the base substrate having the insulator layer formed thereon was confirmed, it was found out that the insulator layer whose thickness partially varies was formed on the bonding surface of the base substrate like FIG. 3.

The base substrate having such an insulator layer formed thereon was immersed in 1% HF for 10 minutes, and the insulator layer was removed by an amount corresponding to a thickness of a small-thickness portion of the insulator layer, i.e., 0.09 μm by etching. As a result, a thickness of the oxide film remaining on the substrate without being etched was 0.06 μm. A boron-doped silicon substrate having resistivity of 0.05 Ω·cm and a diameter of 150 mm as a bond substrate was bonded to the base substrate having the oxide film as the insulator layer exposed on part of the bonding surface thereof in this manner, and a bonding heat treatment was performed at 1150° C. Then, the bond substrate was polished and formed into a thin film, thereby obtaining an SOI substrate having a silicon layer thickness of 10 μm. As described above, a partial SOI substrate having the oxide film with the thickness of 0.06 μm in part of the substrate was fabricated.

In this manner, according to the method for manufacturing a bonded substrate of the present invention, when the porous layer is partially formed on the bonding surface of the base substrate or the porous layer whose thickness partially varies is formed on the same and the porous layer is changed into the oxide film by the thermal oxidation, the insulator layer whose thickness partially varies can be formed on the bonding surface of the base substrate. Further, this insulator layer is removed by an amount corresponding to a thickness of the small-thickness portion by etching, and this base substrate is bonded to the bond substrate, thereby the bonded substrate having the insulator layer in part of the substrate can be easily manufactured.

Furthermore, although a point having the insulator layer and a point having no insulator layer are present in the bonded substrate according to the present invention, since a bonding interface is flat, an interface between the pair of the insulator layer and the base substrate and the thin film layer is flat. Therefore, a device can be fabricated by performing the photolithography process as usual. Accordingly, in case of fabricating a multi-functionalized device having a logic circuit, a DRAM, and others mixedly mounted on the same substrate, the device can be formed at a position of the insulator layer having an optimum film thickness, thereby providing a bonded substrate that enables fabricating a high-performance multi-functionalized device while reducing the number of fabrication steps.

It is to be noted that the present invention is not restricted to the foregoing embodiment. The foregoing embodiment is just an illustrative example, and any example that has substantially the same configuration and exercises the same functions and effects as the technical concept described in claims according to the present invention is included in the technical scope of the present invention.

The invention claimed is:

1. A method for manufacturing a bonded substrate that is formed by bonding a base substrate to a bond substrate and has an insulator layer in part of the bonded substrate, the method comprising at least:
    a porous layer forming step of partially forming a porous layer or forming a porous layer whose thickness partially varies on a bonding surface of the base substrate;
    an insulator layer forming step of performing a heat treatment to the base substrate having the porous layer formed thereon to change the porous layer into the insulator layer, and thereby forming the insulator layer whose thickness partially varies on the bonding surface of the base substrate;
    an insulator layer removing step of removing the insulator layer whose thickness varies by an amount corresponding to a thickness of a small-thickness portion by etching, and thereby exposing the unetched remaining insulator layer on part of the bonding surface of the base substrate;
    a bonding step of bonding the bonding surface of the base substrate on which the unetched remaining insulator layer is exposed to the bond substrate; and
    a thin film forming step of reducing a thickness of the bonded bond substrate and thereby forming a thin film layer.

2. The method for manufacturing a bonded substrate according to claim 1,
    wherein, at the porous layer forming step, in case of forming the porous layer whose thickness partially varies on the bonding surface of the base substrate, at least
    a protective coat is formed on the bonding surface of the base substrate, a resist mask is formed on the protective coat, the protective coat is patterned into a shape of the resist mask, the resist mask is removed, the porous layer is formed on the bonding surface having the patterned protective coat, and the porous layer whose thickness partially varies is thereby formed on the entire bonding surface of the base substrate.

3. The method for manufacturing a bonded substrate according to claim 2,
    wherein, at the porous layer forming step, the porous layer is partially formed or the porous layer whose thickness partially varies is formed on the bonding surface by anodizing the bonding surface of the base substrate.

4. The method for manufacturing a bonded substrate according to claim 3,
    wherein a partial SOI substrate having an insulator layer in part of the bonded substrate is manufactured by using a silicon substrate for the base substrate and/or a bond substrate.

5. The method for manufacturing a bonded substrate according to claim 2,
    wherein, at the porous layer forming step, in case of forming the porous layer whose thickness partially varies on the bonding surface of the base substrate,
    the protective coat is removed with anodizing the bonding surface of the base substrate having the patterned protective coat formed thereon.

6. The method for manufacturing a bonded substrate according to claim 5,
    wherein a partial SOI substrate having an insulator layer in part of the bonded substrate is manufactured by using a silicon substrate for the base substrate and/or a bond substrate.

7. The method for manufacturing a bonded substrate according to claim 6,
    wherein, at the insulator layer forming step, the insulator layer whose thickness partially varies is formed by performing a thermal oxidation treatment to the base substrate having the porous layer formed thereon to change the porous layer into an oxide film.

8. The method for manufacturing a bonded substrate according to claim 2,
    wherein a partial SOI substrate having an insulator layer in part of the bonded substrate is manufactured by using a silicon substrate for the base substrate and/or a bond substrate.

9. The method for manufacturing a bonded substrate according to claim 1,
    wherein, at the porous layer forming step, in case of partially forming the porous layer on the bonding surface of the base substrate, at least
    a resist mask is formed on the bonding surface of the base substrate, the porous layer is formed on the bonding surface having the resist mask formed thereon, the resist mask is thereafter removed, and the porous layer is thereby partially formed on the bonding surface of the base substrate.

10. The method for manufacturing a bonded substrate according to claim 9,
    wherein, at the porous layer forming step, the porous layer is partially formed or the porous layer whose thickness partially varies is formed on the bonding surface by anodizing the bonding surface of the base substrate.

11. The method for manufacturing a bonded substrate according to claim 10,
    wherein a partial SOT substrate having an insulator layer in part of the bonded substrate is manufactured by using a silicon substrate for the base substrate and/or a bond substrate.

12. The method for manufacturing a bonded substrate according to claim 9,
    wherein a partial SOI substrate having an insulator layer in part of the bonded substrate is manufactured by using a silicon substrate for the base substrate and/or a bond substrate.

13. The method for manufacturing a bonded substrate according to claim 1,
    wherein, at the porous layer forming step, the porous layer is partially formed or the porous layer whose thickness partially varies is formed on the bonding surface by anodizing the bonding surface of the base substrate.

14. The method for manufacturing a bonded substrate according to claim 13,
wherein a partial SOT substrate having an insulator layer in part of the bonded substrate is manufactured by using a silicon substrate for the base substrate and/or a bond substrate.

15. The method for manufacturing a bonded substrate according to claim 1,
wherein a partial SOI substrate having an insulator layer in part of the bonded substrate is manufactured by using a silicon substrate for the base substrate and/or a bond substrate.

16. The method for manufacturing a bonded substrate according to claim 1,
wherein, at the insulator layer forming step, the insulator layer whose thickness partially varies is formed by performing a thermal oxidation treatment to the base substrate having the porous layer formed thereon to change the porous layer into an oxide film.

* * * * *